United States Patent [19]
Asai et al.

[11] Patent Number: 5,584,928
[45] Date of Patent: Dec. 17, 1996

[54] MATERIAL FOR WIDE-BAND OPTICAL ISOLATORS AND PROCESS FOR PRODUCING THE SAME

[75] Inventors: Emi Asai; Minoru Imaeda, both of Nagoya, Japan

[73] Assignee: NGK Insulators, Ltd., Japan

[21] Appl. No.: 451,739

[22] Filed: May 26, 1995

[30] Foreign Application Priority Data

Sep. 16, 1994 [JP] Japan .................... 6-222088

[51] Int. Cl.⁶ ............................................. C30B 1/10
[52] U.S. Cl. .................. 117/4; 117/7; 117/10; 117/945
[58] Field of Search ............................. 117/945, 4, 7, 117/10

[56] References Cited

U.S. PATENT DOCUMENTS

| | | | |
|---|---|---|---|
| 3,281,363 | 10/1966 | Gellor et al. | 117/945 |
| 3,291,740 | 12/1966 | Espinosa et al. | 117/945 |
| 4,092,208 | 5/1978 | Brice et al. | 117/945 |
| 4,519,870 | 5/1985 | Matsuzawa et al. | 117/945 |
| 5,021,302 | 6/1991 | Brandle et al. | 428/692 |
| 5,186,866 | 2/1993 | Ryne et al. | 252/584 |
| 5,256,242 | 10/1993 | Imaeda et al. | 117/945 |

FOREIGN PATENT DOCUMENTS

| | | |
|---|---|---|
| 0399665 | 11/1990 | European Pat. Off. . |
| 63-35490 | 2/1988 | Japan . |
| 3-164491 | 7/1991 | Japan . |

OTHER PUBLICATIONS

Tamaki et al., "Magneto–Optical Properties of (TbBI)3Fe5012 and its Application to a 1.5μm Wideband Optical Isolator" 1991, pp. 4581–4583.

Journal of Applied Physics, vol. 70, No. 8, pp. 4581–4583, T. Tamaki et al., "Magnetooptical Properties of $(TbBi)_3Fe_5O_{12}$ And Its Application to a 1.5μm Wideband Optical Isolator".

Patent Abstracts of Japan, vol. 12, No. 242, Jul. 8, 1988 & JP–A–63–035490, Feb. 16, 1988, Abstract.

Patent Abstracts of Japan, vol. 15, No. 403, Oct. 15, 1991 & JP–A–03 164491, Jul. 16, 1991, Abstract.

Patent Abstracts of Japan, vol. 11, No. 273, Sep. 4, 1987 & JP–A–62 078195, Apr. 10, 1987, Abstract.

*Primary Examiner*—Robert Kunemund
*Attorney, Agent, or Firm*—Parkhurst, Wendel & Burr, L.L.P.

[57] ABSTRACT

A material for use in a 1.5 μm wide-band optical isolator, includes a bismuth-substituted terbium-iron garnet single crystal having a composition of $Bi_xTb_{3-x}Fe_5O_{12}$ in which x is 0.35 to 0.45. This bismuth-substituted terbium-iron garnet single crystal is grown by a solid phase reaction. A process for producing such a material is also disclosed.

5 Claims, No Drawings

MATERIAL FOR WIDE-BAND OPTICAL ISOLATORS AND PROCESS FOR PRODUCING THE SAME

BACKGROUND OF THE INVENTION

1. Field of the Invention

The present invention relates to a material for 1.5 µm wide-band optical isolators.

2. Related Art Statement

Recently, there has been a tendency to use long wavelengths in a 1.5 µm band instead of conventional wavelengths in a 1.3 µm band for optical transmission technology. This is because optical transmission loss of an optical fiber is remarkably reduced in the case of 1.5 µm band, so that the light can be easily amplified. Further, there has been a strong demanded for increasing optical transmission capacity by using multiple wavelength optical transmission technology. Therefore, 1.5 µm wide-band optical isolators have rapidly become necessary.

In the multiple wavelength optical transmission, n kinds of laser rays having different wavelengths are modulated into input signals, which are passed through an optical isolator, coupled into an optical fiber by using an optical wave synthesizer, and transmitted together. On a receiving side, the transmitted light is divided into the above laser rays, and intended signals are taken out. The optical isolator is an optical element which functions to pass optical rays in one direction but interrupt them in the reverse direction. Particularly in the case of multiple wavelength optical transmission, the optical isolator to be inserted between the optical fibers is required to function well with respect to a number of multiple optical rays. Thus, the optical isolator must be of a wide band range.

The operating principle of the above optical isolator will be explained. Main constituent elements of the optical isolator are a polarizer, an analyzer and a Faraday rotation element. If light is introduced into the optical isolator in a normal direction, only given optical ray components pass the polarizer. When the polarized optical ray components pass the Faraday rotation element, a deviation angle of these components is turned by 45°. Then, the components pass the analyzer. On the other hand, if the light is introduced into the optical isolator in a reverse direction, only other given optical components pass the analyzer. When these polarized optical ray components pass the Faraday element, the polarized optical ray components are rotated by 45° in the same direction as in the normal direction. Therefore, even if the polarized optical ray components are introduced into the polarizer, the optical rays are interrupted by this polarizer because the deviated direction of the optical rays introduced is orthogonal to the deviating direction in the polarizer.

However, the Faraday rotation angle generally varies depending upon the wavelength. Therefore, as the wavelength of the light source changes, the rotation angle of the optical rays given by the Faraday element deviates from 45°. As a result, the degree at which the light introduced in the reverse direction is interrupted decreases, so that the performance of the optical isolator becomes worse. Therefore, it is necessary to reduce changes in the rotation angle of the Faraday element with changes depending on the wavelength. Particularly, since multiple wavelengths are used in the 1.5 µm band in the case of the 1.5 µm wide-band optical isolator, it is necessary to prevent substantive change in the Faraday rotation angle owing to changes in the wavelength in this wide band range.

Disclosed in an article entitled "Magneto-optical properties of $(TbBi)_3Fe_5O_{12}$ and its application to a 1.5 µm wide-band optical isolator" in "J. Appl. Phys." Vol. 70(8), Oct. 15, 1991 is a bismuth-substituted terbium-iron garnet single crystal having a composition of $Bi_xTb_{3-x}Fe_5O_{12}$ as a material for 1.5 µm wide-band optical isolators. This garnet is a garnet produced by a flux process. However, a uniform composition cannot be realized by this producing process, and the production requires a long time and mass production thereof is not possible.

The present inventors had examined the production of the garnet having the above-mentioned composition system by a liquid phase epitaxial process. However, only thin films having a maximum thickness of around 500 µm can be produced by this process. However, it is necessary to form a film having a thickness of about 1.5 mm to about 2.0 mm as the material for the 1.5 µm wide band optical isolator.

SUMMARY OF THE INVENTION

It is an object of the present invention to produce a material which can minimize the dependency of the Faraday rotation angle upon the wavelength in the range of the 1.5 µm wide band.

Further, it is another object of the present invention to mass produce such a material. Furthermore, it is a further object of the present invention to make the composition of the material uniform. In addition, it is still a further object of the present invention to enable the formation of the single crystal film at a sufficiently large thickness.

The present invention relates to a process for producing a material for use in a 1.5 µm wide-band optical isolator, said material comprising a bismuth-substituted terbium-iron garnet single crystal having a composition of $Bi_xTb_{3-x}Fe_5O_{12}$ in which x is 0.35 to 0.45, said bismuth-substituted terbium-iron garnet single crystal being grown by a solid phase reaction.

The above process for producing the bismuth-substituted terbium-iron garnet preferably includes the steps of:

(1) producing a powdery raw material by a co-precipitating technique;

(2) producing a calcined product by calcining the powdery raw material at not less than 900° C. but not more is than (1200-400x)° C.;

(3) milling the calcined product into a powder;

(4) molding the resulting powder;

(5) producing a polycrystal product by firing the resulting molding at not less than 1140° C. but not more than (1360-400x)° C.;

(6) joining a seed single crystal to the resulting polycrystal product; and (7) converting the joined polycrystalline body into a single crystal by heating the joint body at a growing temperature of a not less than (1435-400x)° C. to not more than (1455-400x)° C., in which "x" is the same meaning as above, i.e., x is 0.35 to 0.45.

The present invention also relates to a material for use in a 1.5 µm wide-band optical isolator, said material comprising a bismuth-substituted terbium-iron garnet single crystal having a composition of $Bi_xTb_{3-x}Fe_5O_{12}$ in which x is 0.35 to 0.45, said bismuth-substituted terbium-iron garnet single crystal being grown by a solid phase reaction.

The above material preferably has the x value of 0.36 to 0.42, more preferably 0.37 to 0.40.

The present invention has been accomplished as follows.

The present inventors had looked for materials free from dependency of Faraday rotation angle upon the wavelength, and particularly studied the dependency of Faraday rotation angle upon wavelength through the preparation of ceramic materials having a variety of different compositions by the solid phase reaction process. During this course of study, the inventors have tried to produce particularly the bismuth-substituted terbium-iron garnet single crystals by the solid phase reaction process.

As a result, it was found that bismuth-substituted single crystals having small dependency of Faraday rotation angle upon wavelength could be mass produced, and that the single crystals could be formed in sufficient thicknesses of not less than 1.5 mm, and their composition could be made uniform. In this producing process, the inventors have found that when the bismuth-substituted single crystals were controlled to have a specific composition range, the single crystals exhibited an almost constant Faraday rotation angle over a wide band range in the case of 1.5 μm band. The inventors have reached the present invention based on this knowledge.

In the present invention, the term "1.5 μm band" is used in the sense of an ordinary meaning, which means a wavelength range of 1.50 μm to 1.60 μm. Particularly, the dependency of Faraday rotation angle upon wavelength was measured at a wavelength near 1.55 μm.

The term "solid phase reaction process" in the present invention means a process in which a seed single crystal is joined to a polycrystalline body, and the joined body is heated to convert the polycrystalline body to a single crystal. As to the solid phase reaction itself, NGK's Japanese patent application Laid-open Nos. 3-164,491 and 63-35,490 disclose a process for producing garnet type ferrite single crystals. The composition of the garnet in these applications differs from that of the garnet of the present invention, and the specific garnet-producing condition in the present invention is not described in these applications.

The bismuth-substituted terbium-iron garnet having the above-mentioned composition according to the present invention is preferably produced by the solid phase reaction process as follows. That is, a powdery garnet raw material is produced by the co-precipitating process. At that time, it is preferable that two kinds of powdery raw materials having different composition ratios are produced, and mixed at given mixing ratios. More specifically, each raw material powder is calcined to produce a calcined body, which is milled. Thereby, two kinds of the powdery raw materials are produced. These powders are mixed to formulate a mixed powder, which is molded and fired to produce a polycrystal product.

In the calcining step, the calcining temperature is preferably set in the following temperature range. That is, the upper limit of the calcining temperature, which depends upon the x value, is preferably set at $(1200-400x)°$ C. Therefore, since x is 0.35–0.45, the maximum calcining temperature is set in a range of 1020° C. to 1060° C., although it varies with the x value.

In the above firing step, the firing temperature is preferably set in the following temperature range. First, the lower firing temperature limit is preferably set at 1140° C. The upper firing temperature limit depends on the x value, and is preferably set at $(1360-400x)°$ C. Therefore, since x is 0.35–0.45, the maximum firing temperature is preferably set in a range of 1180° C. to 1220° C., although it varies with the x value.

A single crystal is joined to the thus obtained polycrystalline product, and the resulting joined body is heated at a given single crystal-growing temperature to convert the polycrystalline body to a single crystal. At that time, the growing temperature is preferably set in the following temperature range. First, the upper growing temperature limit, which depends upon the x value, is preferably set at $(1455-400x)°$ C. Therefore, since x is 0.35–0.45, the maximum firing temperature is set in a range of 1275° C. to 1315° C., although it varies with the x value. The lower growing temperature limit is preferably lower than the higher growing temperature limit by not more than 20° C. Therefore, it is preferably in a range of 1255° C. to 1295° C. The seed single crystal and any remaining polycrystalline product are removed at need.

The present inventors have found that when the first calcining temperature, the firing temperature for the polycrystalline product, and the single crystal-growing temperature are restricted to the above-mentioned respective narrow ranges, the absorption loss particularly as an optical element can be minimized. The time periods required for the above calcining temperature, the polycrystal body-firing temperature and the single crystal-growing temperature, respectively, can be easily determined by the skilled person in the art. That is, the higher the temperature, the longer is s the time period required, while the lower the temperature, the shorter is the time period required.

As the single crystal-growing process in the solid phase reaction, a single crystal garnet-producing process disclosed, for example, in NGK's Japanese patent application laid-open No. 63-35,490 is preferably employed. As the single crystal, yttria iron-base garnet (YIG) obtained by the floating zone (FZ) process, bismuth-substituted terbium-iron garnet (BiTbIG) obtained by the liquid phase epitaxial (LPE) process, s etc. may be employed. The single crystal-growing step is effected in an oxygen stream. As the firing process, an HIP process in which a mixed gas of argon and oxygen (20% oxygen) is used under pressure of 500 to 1600 $kgf/cm^2$ may be employed.

The thus produced single crystal ceramic is the bismuth-substituted terbium-iron garnet having above-mentioned composition. Particularly, the substituting ratio of bismuth is important, and x must be within a range of 0.35 to 0.45. The x value is preferably in a range of 0.36 to 0.42. Furthermore, the x value is more preferably 0.37 to 0.40, because the Faraday rotation angle does not change much in this range. When the x value is set at 0.38, no change in the Faraday rotation angle is detected.

Experiments: Producing examples of garnet single crystals

In the following, more concrete experimental results will be explained. First, garnet single crystals having compositions given below were produced in the following producing examples.

EXAMPLE 1

Iron sulfate, terbium nitrate and bismuth nitrate were prepared as starting materials. Then, two kinds of synthesized powders A and B were produced according to the co-precipitating process by using these starting materials. The molar ratios of the synthesized powder A were Fe: 62.00, Te: 32.93, and Bi: 5.07. The molar ratios of the synthesized powder B were Fe: 63.00, Te: 32.07, and Bi: 4.93.

Each of the synthesized powders A and B was dried and calcined at 1020° C. for 4 hours, and the calcined product was milled, thereby obtaining two kinds of powders. The thus obtained powders were wet mixed to give an intended composition, so that a mixed powder having a composition of $Bi_{0.40}Tb_{2.60}Fe_5O_{12}$ was obtained. The resulting mixed powder was molded, and the molded body was fired at 1170° C. for 10 hours. The resulting fired body was cut to obtain a rectangular parallelopiped block-shaped body having a size of 5 mm×10 mm×10 mm.

A seed single crystal prepared from a single crystal body of $Y_3Fe_5O_{12}$ was joined to this block. A single crystal was grown from the polycrystalline body by heating the resulting joined body at 1285° C. for 12 hours according to a hot isostatic press under the condition that the oxygen content of an atmosphere: 20%, and the atmosphere pressure: 1500 atm. Finally, a single crystal of a bismuth-substituted terbium-iron garnet having a composition of $Bi_{0.40}Tb_{2.60}Fe_5O_{12}$ and a size of 5mm×10mm×3mm was obtained by removing the seed single crystal and the remaining polycrystalline body.

EXAMPLE 2

A single crystal of a bismuth-substituted terbium-iron garnet having a composition of $Bi_{0.38}Tb_{2.62}Fe_5O_{12}$ was obtained in the same manner as in Example 1, except that the molar ratios of the synthesized powder A were Fe: 62.00, Te: 33.19, and Bi: 4.18, and that the molar ratios of the synthesized powder B were Fe: 63.00, Te: 32.31, and Bi: 4.69.

In Example 2, a calcining step was carried out at 1030° C. for 4 hours, and a firing step was carried out at 1180° C. for 10 hours, while a single crystal-growing temperature was carried out at 1290° C. for 20 hours.

EXAMPLE 3

A single crystal of a bismuth-substituted terbium-iron garnet having a composition of $Bi_{0.36}Tb_{2.64}Fe_5O_{12}$ was obtained in the same manner as in Producing Example 1, except that the molar ratios of the synthesized powder A were Fe: 62.00, Te: 33.44, and Bi: 4.56, and that the molar ratios of the synthesized powder B were Fe: 63.00, Te: 32.56, and Bi: 4.44.

In Example 3, a calcining step was carried out at 1040° C. for 4 hours, and a firing step was carried out at 1210° C. for 10 hours, while a single crystal-growing temperature was carried out at 1305° C. for 12 hours.

OTHER EXAMPLES

Single crystals of bismuth-substituted terbium-iron garnets each having a composition of $Bi_xTb_{3-x}Fe_5O_{12}$ (x given in Table 1) were obtained in the same manner as in Examples 1, 2 and 3.

Measurement of a coefficient of a wavelength in a Faraday rotation angle of the single crystal product With respect to each of the single crystals produced in the above examples, a coefficient of a wavelength of a Faraday rotation angle at a wavelength of 1.55 μm was measured. This coefficient of wavelength was calculated according to the following formula:

Coefficient of wavelength in Faraday rotation angle %/nm=[{(Faraday rotation angle at wavelength of 1.55 μm)-(Faraday rotation angle of wavelength of 1.75 μm)}/ (Faraday rotation angle at wavelength of 1.55 μm)]×1/20×100

TABLE 1

| x | Coefficient of wavelength in Faraday rotation (%/nm) |
| --- | --- |
| 0.33 | −0.06 |
| 0.35 | −0.03 |
| 0.36 | −0.02 |
| 0.37 | −0.01 |
| 0.38 | 0.00 |
| 0.39 | 0.01 |
| 0.40 | 0.01 |
| 0.42 | 0.02 |
| 0.45 | 0.03 |
| 0.46 | 0.04 |

As is seen from the above results, if the bismuth-substituted ratio x in the bismuth-substituted terbium-iron garnet single crystals produced with the respective compositions by the above-mentioned producing processes is in a range of 0.35–0.45, the coefficient of wavelength in the Faraday rotation angle can be remarkably reduced in the 1.5 μm wide-band range. In particular, if x is in a range of 0.36 to 0.42, the coefficient of wavelength in the Faraday rotation angle is further reduced. If x is in a range of 0.37 to 0.40, the coefficient of wavelength in the Faraday rotation angle is furthermore reduced. In addition, if the composition of x=0.38 is employed, the above coefficient of wavelength is almost zero.

Relationship between the producing condition and the light-absorption loss

Bismuth-substituted terbium iron garnet single crystals were produced under the following producing condition in the same manner as in Example 1, provided that x was set at 0.38. In Run No. 1, a co-precipitated powder-calcining temperature, a polycrystal product-firing temperature and a single crystal-growing temperature were varied as shown in Tables 2 and 3.

With respect to each of the single crystals in the following runs, an insertion loss was measured. At that time, after the single crystal was worked in such a thickness as to cause a 45° Faraday rotation, its opposite surfaces were optically lapped, and an AR film was coated upon each of the thus lapped surfaces. As a light source, a semiconductor laser having a wavelength of 1.55 μm was used. As a light-receiving section, a light power meter was used, and an insertion loss was measured. Measurement results are also shown in Tables 2 and 3.

TABLE 2

| Run No. | Calcining temperature (°C.) | Firing temperature (°C.) | Growing temperature (°C.) | Insertion loss |
| --- | --- | --- | --- | --- |
| 1 | 900 | 1140 | 1283 | 1.1 |
| 2 | 900 | 1140 | 1293 | 1.0 |
| 3 | 900 | 1140 | 1303 | 1.2 |
| 4 | 900 | 1180 | 1283 | 1.0 |
| 5 | 900 | 1180 | 1293 | 0.7 |
| 6 | 900 | 1180 | 1303 | 0.8 |
| 7 | 900 | 1208 | 1283 | 1.0 |
| 8 | 900 | 1208 | 1293 | 0.9 |
| 9 | 900 | 1208 | 1303 | 1.1 |
| 10 | 970 | 1140 | 1283 | 1.0 |
| 11 | 970 | 1140 | 1293 | 0.8 |
| 12 | 970 | 1140 | 1303 | 1.0 |
| 13 | 970 | 1180 | 1283 | 0.7 |
| 14 | 970 | 1180 | 1293 | 0.5 |

TABLE 2-continued

| Run No. | Calcining temperature (°C.) | Firing temperature (°C.) | Growing temperature (°C.) | Insertion loss |
|---|---|---|---|---|
| 15 | 970 | 1180 | 1303 | 0.7 |
| 16 | 970 | 1208 | 1283 | 1.0 |
| 17 | 970 | 1208 | 1293 | 0.8 |
| 18 | 970 | 1208 | 1303 | 1.0 |

TABLE 3

| Run No. | Calcining temperature (°C.) | Firing temperature (°C.) | Growing temperature (°C.) | Insertion loss |
|---|---|---|---|---|
| 19 | 1048 | 1140 | 1283 | 1.1 |
| 20 | 1048 | 1140 | 1293 | 0.9 |
| 21 | 1048 | 1140 | 1303 | 1.2 |
| 22 | 1048 | 1180 | 1283 | 0.9 |
| 23 | 1048 | 1180 | 1293 | 0.7 |
| 24 | 1048 | 1180 | 1303 | 0.8 |
| 25 | 1048 | 1208 | 1283 | 1.1 |
| 26 | 1048 | 1208 | 1293 | 0.8 |
| 27 | 1048 | 1208 | 1303 | 1.0 |
| 28 | 860 | 1180 | 1293 | 2.3 |
| 29 | 1090 | 1180 | 1293 | 2.5 |
| 30 | 970 | 1120 | 1293 | 2.0 |
| 31 | 970 | 1230 | 1293 | 1.7 |
| 32 | 970 | 1180 | 1278 | — |
| 33 | 970 | 1180 | 1308 | 2.8 |

When the x is 0.38, the upper limit of the calcining temperature (1200-400x)° C. is 1048° C., the upper limit of the firing temperature (1360-400x)° C. is 1208° C., the lower limit of the growing temperature (1435-400x)° C. is 1283° C., and the upper limit of the growing temperature (1455-400x)° C. is 1303° C. As is seen from the results in Run Nos. 1–27 in Tables 2 and 3, if the treatment falls in the condition of the calcining temperature of 900°–1048° C., the firing temperature of 1140°–1208° C. and the growing temperature of 1283–1303, the insertion loss can be remarkably reduced. On the other hand, it is seen that if the treatment falls outside this condition as in the case of Run Nos. 28–33, the insertion loss is worse.

Similarly, results were obtained in the case of the single crystals in which x is 0.40 or 0.36. For example, in the case of a single crystal having a composition of $Bi_{0.40}Tb_{2.60}Fe_5O_{12}$ (x=0.40), the upper limit of the calcining temperature (1200-400x)° C. is 1040° C. the upper limit of the firing temperature (1360-400x)° C. is 1200° C., the lower limit of the growing temperature (1435-400x)° C. is 1275° C., and the upper limit of the growing temperature (1455-400x)° C. is 1295° C. When the condition was the calcining temperature of 1020° C., the firing temperature of 1170° C. and the growing temperature of 1285° C., the insertion loss of the light was 0.7 dB.

For example, in the case of the single crystal of $Bi_{0.36}Tb_{2.64}Fe_5O_{12}$ in which x=0.36, the upper limit of the calcining temperature (1200-400x)° C. is 1056° C., the upper limit of the firing temperature (1360-400x)° C. is 1216° C., the lower limit of the growing temperature (1435-400x)° C. is 1291° C., and the upper limit of the growing temperature (1455-400x)° C. is 1311° C. When the condition was the calcining temperature of 1040° C., the firing tem-perature of 1210° C. and the growing temperature of 1305° C. the insertion loss was 0.6 dB.

As mentioned above, when the calcining temperature for the co-precipitated powdery raw material, the polycrystalline body-firing temperature and the single crystal-growing temperature are limited according to the above-mentioned conditions in the production of the bismuth-substituting terbium-iron garnet single crystal, the light absorption loss of the single crystal can be minimized. Thus, the material comprising such a bismuth-substituting terbium-iron garnet single crystal is particularly suitable for optical elements.

As having been explained, according to the present invention, since the dependency of Faraday rotation angle upon wavelength can be minimized in the 1.5 μm wide-band range, the single crystal having the above-mentioned composition can be mass produced, and its composition can be made uniform. In addition, the thickness of the single crystal can be made sufficiently great. As a result, the 1.5 μm wide-band optical isolators can be mass produced, which are extremely suitable for multiple optical transmission.

What is claimed is:

1. A process for producing a material for use in a 1.5 μm wide-band range optical isolator, said material comprising a bismuth-substituted terbium-iron garnet single crystal having a composition of $Bi_xTb_{3-x}Fe_5O_{12}$ in which x is 0.35 to 0.45, wherein said bismuth-substituted terbium-iron garnet single crystal being is by a solid phase reaction.

2. A process for producing a material for use in a 1.5 μm wide-band range optical isolator, said material comprising a bismuth-substituted terbium-iron garnet single crystal having a composition of $Bi_xTb_{3-x}Fe_5O_{12}$ in which x is 0.35 to 0.45, said process comprising the steps of:

(1) producing a powdery raw material by a co-precipitating technique;

(2) producing a calcined product by calcining the powdery raw material at not less than 900° C. but not more than (1200-400x)° C.;

(3) milling the calcined product into a powder;

(4) molding the resulting powder;

(5) producing a polycrystal product by firing the resulting molding at not less than 1140° C. but not more than (1360-400x)° C.;

(6) joining a seed single crystal to the resulting polycrystal product; and (7) converting the joined polycrystalline body to a single crystal by heating the joint body at a growing temperature of not less than (1435-400x)° C. but not more than (1455-400x)° C.

3. A material for use in a 1.5 μm wide-band optical isolator, said material comprising a bismuth-substituted terbium-iron garnet single crystal having a composition of $Bi_xTb_{3-x}Fe_5O_{12}$ in which x is 0.35 to 0.45, said bismuth-substituted terbium-iron garnet single crystal being grown by a solid phase reaction.

4. The material claimed in claim 3, wherein x is 0.36 to 0.42.

5. The material claimed in claim 3, wherein x is 0.37 to 0.40.

* * * * *